United States Patent [19]

Lee

[11] Patent Number: 6,110,764
[45] Date of Patent: Aug. 29, 2000

[54] METHOD OF MANUFACTURING AN ASSEMBLY WITH DIFFERENT TYPES OF HIGH-VOLTAGE METAL-OXIDE-SEMICONDUCTOR DEVICES

[75] Inventor: Jia-Sheng Lee, Hsinchu, Taiwan

[73] Assignee: United Microelectronics Corp., Hsinchu, Taiwan

[21] Appl. No.: 09/114,006

[22] Filed: Jul. 10, 1998

[30] Foreign Application Priority Data

May 4, 1998 [TW]  Taiwan ................................. 87106837

[51] Int. Cl.⁷ ................................................ H01L 21/332
[52] U.S. Cl. ............................. 438/138; 438/187; 437/40
[58] Field of Search ..................... 438/138, 187; 437/40

[56] References Cited

U.S. PATENT DOCUMENTS

| | | | |
|---|---|---|---|
| 3,919,008 | 11/1975 | Iwamatsu | 148/187 |
| 5,721,148 | 2/1998 | Nishimura | 437/40 |
| 5,757,365 | 5/1998 | Kakumu | 437/40 |

*Primary Examiner*—David Nelms
*Assistant Examiner*—Pho Luy
*Attorney, Agent, or Firm*—Thomas, Kayden, Horstemeyer & Risley

[57] ABSTRACT

A method of manufacturing high-voltage MOS devices that uses trenches instead of field oxide layer as the isolating structure, and employs a vertical layout rather than a horizontal layout to lengthen the drift region for a given device area in a wafer. Therefore, this invention is capable of fabricating CMOS transistors in the sub-micron regime, and hence is able to increase the level of circuit integration for a given wafer. Furthermore, the present invention provides a method of manufacturing an assembly with different types of high-voltage MOS devices. By making minor adjustments in the height of the $N^-$ regions underneath the source/drain ($N^+$) regions of different devices, an assembly of MOS devices each having a different voltage operating range can be obtained on an integrated circuit. Moreover, the minor adjustments can be achieved simply by etching the $N^-$ regions to different degrees.

13 Claims, 10 Drawing Sheets

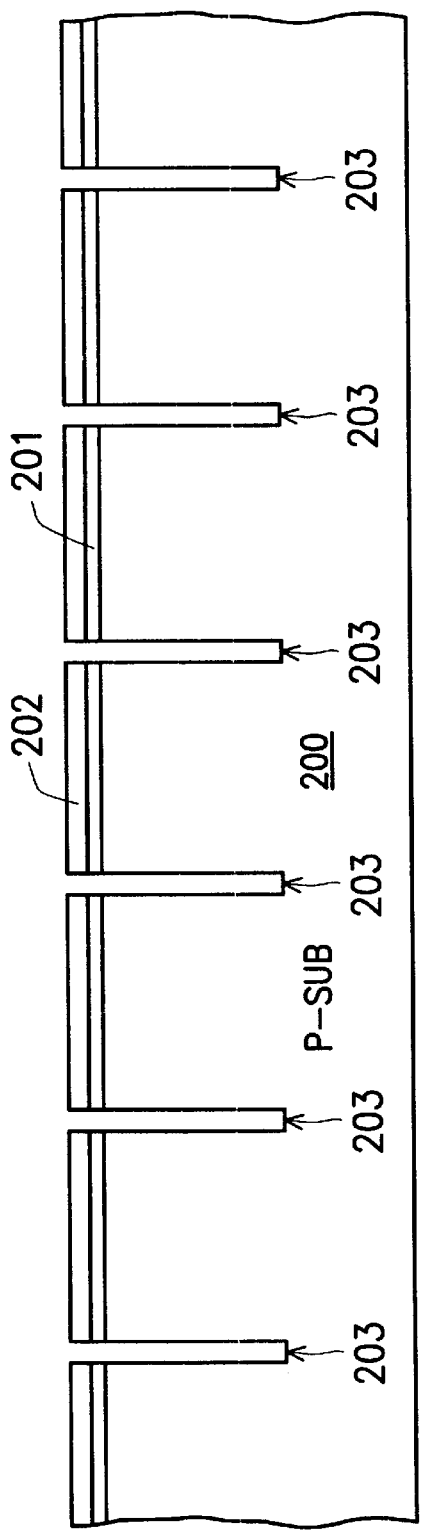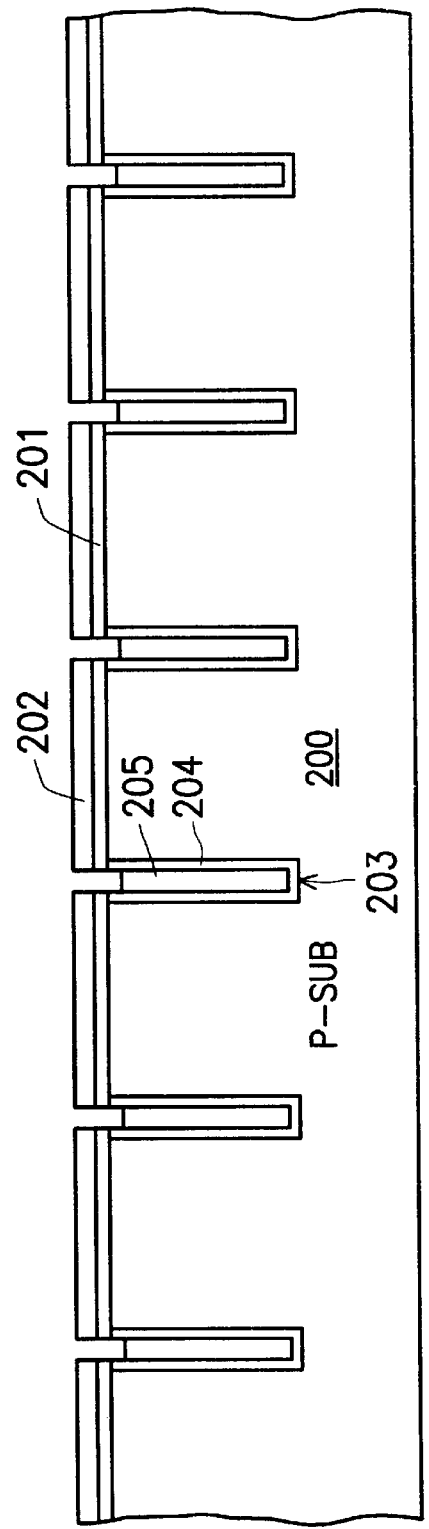

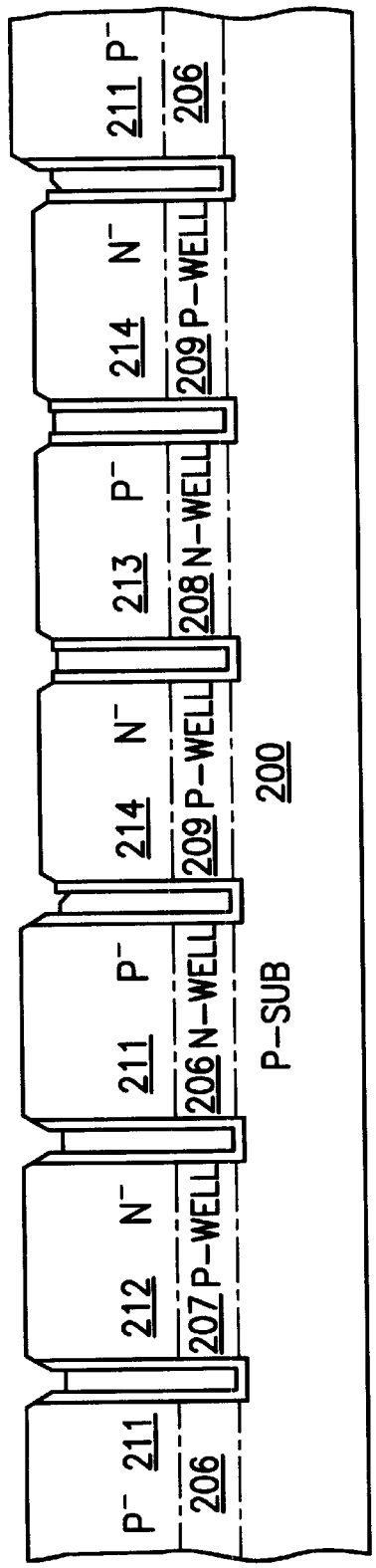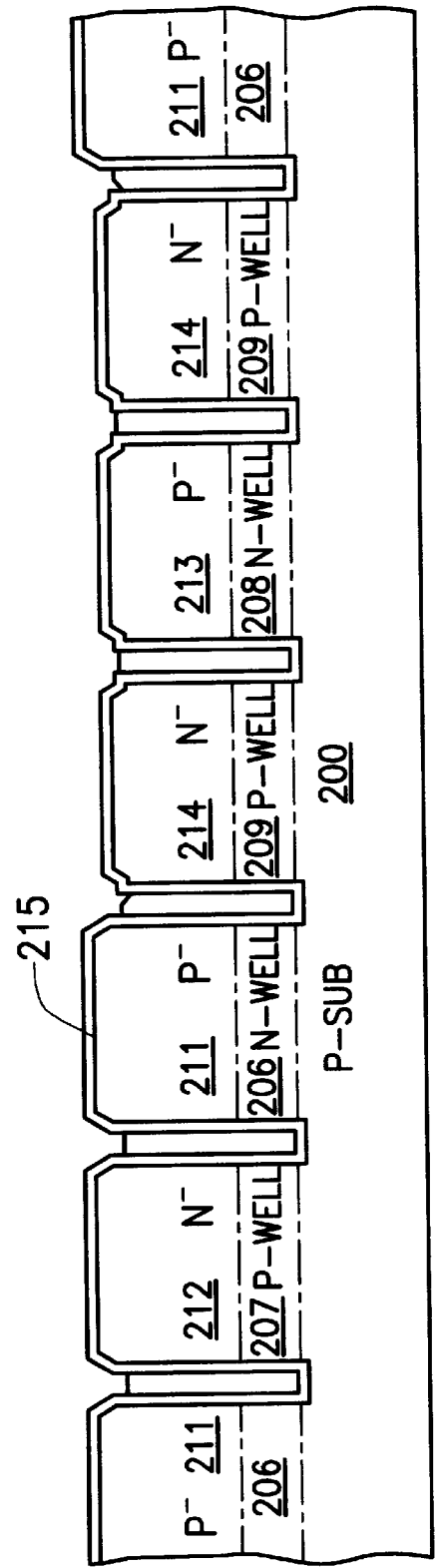

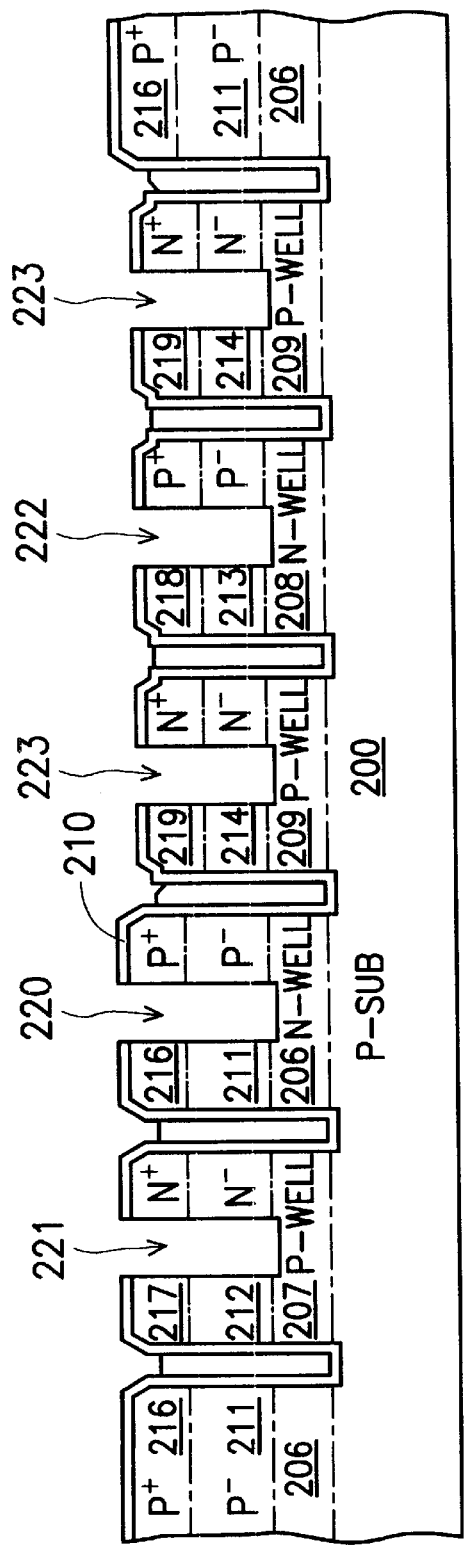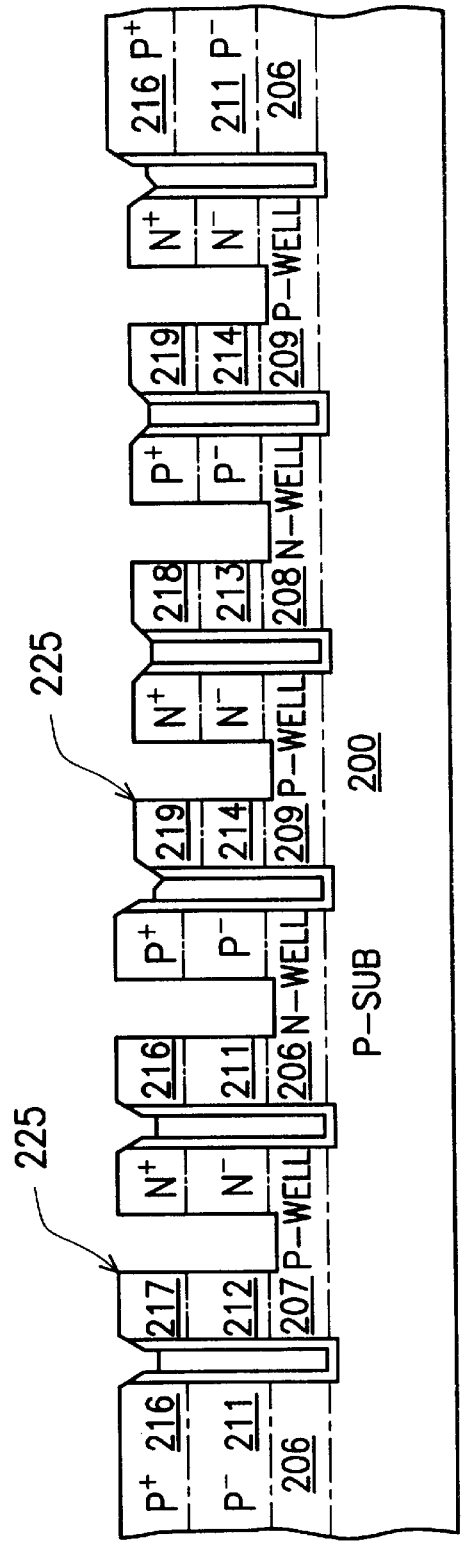

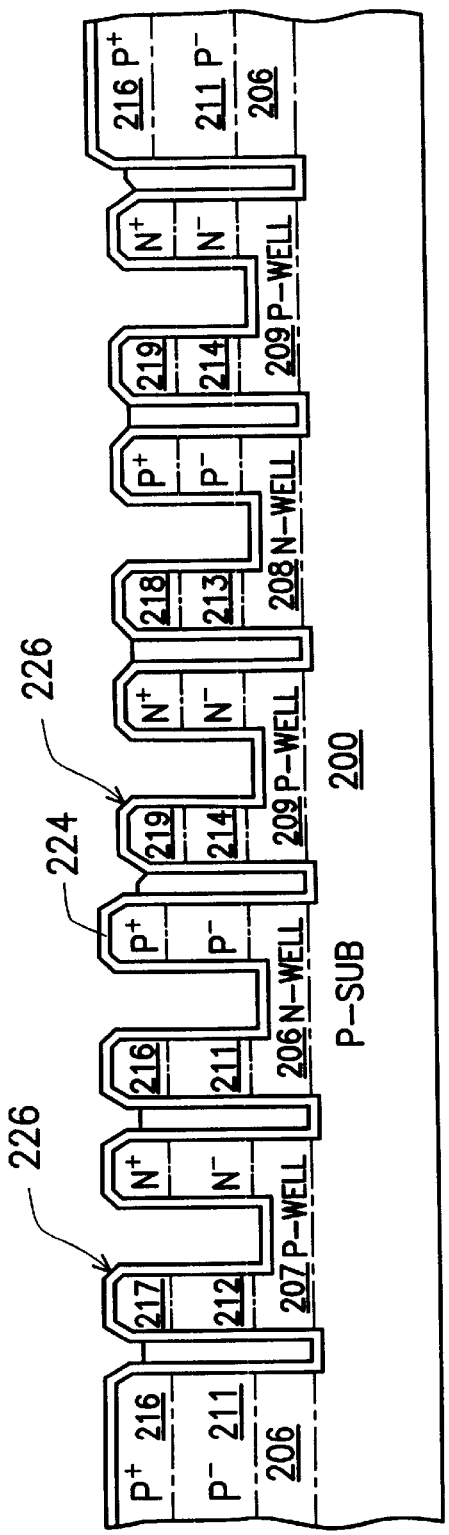
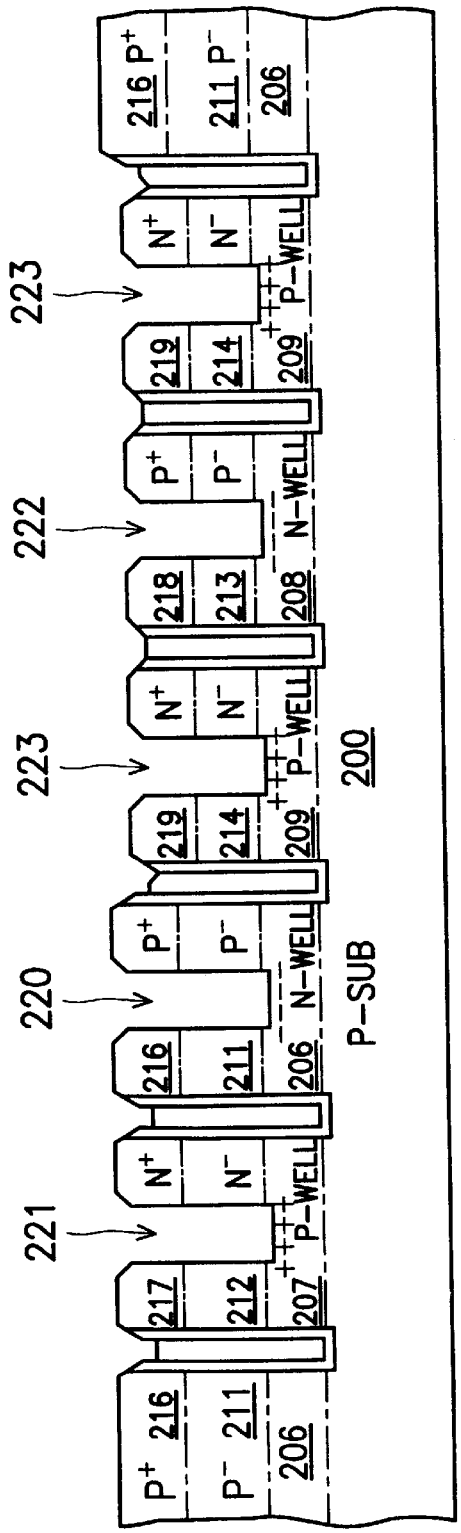

METHOD OF MANUFACTURING AN ASSEMBLY WITH DIFFERENT TYPES OF HIGH-VOLTAGE METAL-OXIDE-SEMICONDUCTOR DEVICES

CROSS-REFERENCE TO RELATED APPLICATION

This application claims the priority benefit of Taiwan application Ser. No. 87106837, filed May 4, 1998, the full disclosure of which is incorporated herein by reference.

BACKGROUND OF THE INVENTION

1. Field of Invention

The present invention relates to a method of manufacturing high-voltage metaloxide-semiconductor (MOS) devices. More particularly, the present invention relates to a method of manufacturing an assembly with different types of vertical high-voltage MOS devices.

2. Description of Related Art

As devices are miniaturized, channel length is also shortened, leading to higher operation speed. However, accompanying the shortening of the device channel is a problem referred to as short channel effect. In general, an electric field within a transistor channel is governed by the relationship Field=Voltage/Channel Length. Therefore, if the applied voltage to a transistor remains unchanged while its channel length is shortened, electrons will have higher energies because they are accelerating in a higher electric field. Consequently, the likelihood of an electrical breakdown is greatly increased.

Generally, a high-voltage MOS device is capable of functioning normally despite the application of a high voltage because an isolating layer and a drift region underneath the isolating layer serves to increase the distance of separation between the source/drain terminal and the gate terminal of the MOS device.

FIGS. 1A, 1B and 1C are cross-sectional views showing the structures of conventional high-voltage MOS devices.

In FIG. 1A, the high-voltage MOS device has a P$^-$ substrate 100, N$^-$ doped regions 101, N$^+$ doped regions 102, and a gate layer 103. The N$^+$ doped region 102 is the source/drain region, and the N$^-$ doped region 101 serves to increase the distance of separation between the source/drain terminal and the gate terminal.

In FIG. 1B, the high-voltage MOS device has a P$^-$ substrate 110. N$^-$ doped regions 111, N$^+$ doped regions 112, spacers 113 and a gate layer 114. The N$^+$ doped region 112 is the source/drain region, and the N$^-$ doped region 111 and the spacer 113 serve to increase the distance of separation between the source/drain terminal and the gate terminal.

In FIG. 1C, the high-voltage MOS device has a P$^-$ substrate 120, N$^-$ doped regions 121, N$^+$ doped regions 122, field oxide (FOX) layer 123 and a gate layer 124. The N$^+$ doped region 122 is the source/drain region, and the N$^-$ doped region 121 and the field oxide layer 123 serve to increase the distance of separation between the source/drain terminal and the gate terminal.

However, the high-voltage MOS devices shown in FIGS. 1A, 1B and 1C all have planar structures. These devices must be laterally laid out and hence sufficient space must be provided to accommodate the required isolation layer. With this type of design, the surface area needed to form these devices increases and the critical dimensions are difficult to reduce. Ultimately, the level of integration of these devices will be affected. In other words, it is difficult to shorten the channel length of these conventional high-voltage MOS devices, thus making the development of sub-micron high-voltage MOS devices impossible.

Furthermore, besides occupying a larger amount of surface area and therefore affecting the level of integration, it is difficult for conventional high-voltage devices to function normally when they are formed side-by-side with ordinary devices on the same integrated circuit. In other words, it is difficult to fabricate different types of high-voltage devices each having a definite range of operating voltage on the same integrated circuit.

In light of the foregoing, there is a need to provide an improved method of manufacturing high-voltage MOS devices.

SUMMARY OF THE INVENTION

Accordingly, the present invention provides a method of manufacturing vertical high-voltage MOS devices so that by making minor adjustments in the height of the N$^-$ regions of different devices, an assembly with different types of high-voltage MOS devices, each having a different voltage operating range, can operate in parallel on an integrated circuit.

In another aspect, the present invention provides a method of manufacturing an assembly with different types of high-voltage MOS devices that replaces the conventional lateral type of structure with a vertical of structure, thereby saving significant layout area.

In yet another aspect, this invention provides a method of manufacturing an assembly with different types of high-voltage MOS devices in the sub-micron range so that the level of integration for a given area on a silicon wafer can be increased.

To achieve these and other advantages and in accordance with the purpose of the invention, as embodied and broadly described herein, the invention provides a method of manufacturing an assembly with different types of high-voltage MOS devices. The method is comprised of the steps of first providing a semiconductor substrate, and then sequentially forming a first oxide layer and a first silicon nitride layer over the substrate. Next, a portion of the first silicon nitride layer, the first oxide layer and the semiconductor substrate are etched to form isolating trenches. Thereafter, a second oxide layer is deposited over the trench surface using an oxidation method, and then a third oxide layer is deposited into the trenches. Subsequently, a first N-well, a first P-well, a second N-well and a second P-well are formed between the trenches, wherein the trenches are used as isolating structures. Next, the silicon nitride layer and the first oxide layer are removed, and then a fourth oxide layer is formed over the semiconductor substrate.

After that, a first P$^-$ region is formed inside the first N-well, and a second P$^-$ region is form inside the second N-well. Similarly, a first N$^-$ region is formed inside the first P-well and a second N$^-$ region is formed inside the second P-well. Next, the fourth oxide layer above the second N-well and the second P-well as well as a portion of the second P$^-$ region and the second N$^-$ region are removed so that the top surface of the second P$^-$ region and the second N$^-$ region are lower than the top surface of the first P$^-$ region and the second N$^-$ region. Thereafter, the fourth oxide layer is completely removed, and then a filth oxide layer is formed over the semiconductor substrate. Subsequently, a first P$^+$ region is formed in the first N-well, and a second P$^+$ region is formed in the second N-well. Similarly, a first N$^+$ region is formed in the first P-well, and a second N$^+$ region is formed in the second P-well. Next, a first etching operation is carried out, sequentially etching a portion of the fifth oxide layer, the first P$^+$ region and the first P$^-$ region within the first N-well region using the interface between the first P$^-$ region and the first N-well as an etching stop, thereby forming a first opening. Similarly, a portion of the fifth oxide layer, the first N$^+$ region and the first N$^-$ region within the first P-well region are sequentially etched using the interface between the first N$^-$ region and the first P-well as an etching stop, thereby forming a second opening.

In a subsequent step, a second etching operation is carried out sequentially etching a portion of the fifth oxide layer, the second P$^+$ region and the second P$^-$ region within the second N-well region using the interface between the second P$^-$ region and the second N-well as an etching stop, thereby forming a third opening. Similarly, a portion of the fifth oxide layer, the second N$^+$ region and the second N$^-$ region within the second P-well region are sequentially etched using the interface between the second N$^-$ region and the second P-well as an etching stop, thereby forming a fourth opening. Thereafter, the fifth oxide layer is removed, and then a sixth oxide layer is formed over the semiconductor substrate.

Next, a PMOS punchthrough implant and a threshold voltage implant of the first N-well and the second N-well are carried out. Similarly, an NMOS punchthrough implant and a threshold voltage implant of the first P-well and the second P-well are carried out. Then, the sixth oxide layer is removed. Thereafter, a gate oxide layer is formed above the semiconductor substrate. Subsequently, a first conductive layer is formed above the gate oxide layer at the bottom of the first opening inside the first N-well; a second conductive layer is formed above the gate oxide layer at the bottom of the second opening inside the first P-well; a third conductive layer is formed above the gate oxide layer at the bottom of the third opening inside the second N-well; and a fourth conductive layer is formed above the gate oxide layer at the bottom of the fourth opening inside the second P-well. Next, the first N-well and the second N-well regions are lightly implanted using P-type dopants, thereby forming a third P$^-$ region inside the first N-well underneath the first opening and a fourth P$^-$ region inside the second N-well underneath the third opening. Finally, the first P-well and the second P-well regions are lightly implanted using N-type dopants, thereby forming a third N$^-$ region inside the first P-well underneath the second opening and a fourth N$^-$ region inside the second P-well underneath the fourth opening.

According to one preferred embodiment of this invention, the third oxide layer is formed by high-density plasma chemical vapor deposition.

According to another preferred embodiment of this invention, the step of forming the first N-well, the first P-well, the second N-well and the second P-well includes implanting N-type dopants into regions where the first N-well and the second N-well are desired, and implanting P-type dopants into regions where the first P-well and the second P-well are desired. Thereafter, the implanted heat is used to drive the dopants in. According to one preferred embodiment of this invention, the step of forming the first P$^-$ region, the second P$^-$ region, the first N$^-$ region and the second N$^-$ region further includes implanting low level concentration P-type dopants into the first N-well and the second N-well, and implanting low level concentration N-type dopants into the first P-well and the second P-well, and then heat is used to drive the dopants in. Hence, a first P$^-$ region is formed in the first N-well; a second P$^-$ region is formed in the second N-well; a first N$^-$ region is formed in the first P-well; and a second N$^-$ region is formed in the second P-well.

According to yet another preferred embodiment of this invention, the step of forming the first P$^+$ region, the second P$^+$ region, the first N$^+$ region and the second N$^+$ region further includes implanting high level concentration P-type dopants into the first N-well and the second N-well, and implanting high level concentration N-type dopants into the first P-well and the second P-well, and then heat is used to drive the dopants in. Hence, a first P$^+$ region is formed in the first N-well; a first N$^+$ region is formed in the first P-well: a second P$^+$ region is formed in the second N-well; and a second N$^+$ region is formed in the second P-well.

According to one preferred embodiment of this invention, the step of removing the fifth oxide layer and then forming the sixth oxide layer removes sharp edges on the semiconductor substrate surface.

According to another preferred embodiment of this invention, dopants P$^{31}$ and BF$_2$ are used in the respective PMOS punchthrough implant and threshold voltage implant of the first N-well and the second N-well, and dopants B$^{11}$ and BF$_2$ are used in the respective NMOS punchthrough implant and threshold voltage implant of the first P-well and the second P-well.

According to one preferred embodiment of this invention, the step of forming the first conductive layer, the second conductive layer, the third conductive layer and the fourth conductive layer includes depositing a polysilicon layer over the gate oxide layer, and then doping the polysilicon layer. Thereafter, the doped polysilicon layer is patterned to form a first conductive layer in the first opening, a second conductive layer in the second opening, a third conductive layer in the third opening and a fourth conductive layer in the fourth opening. The first conductive layer only partially covers the bottom part of the first opening, and the second conductive layer only partially covers the bottom part of the second opening. Similarly, the third conductive layer only partially covers the bottom part of the third opening, and the fourth conductive layer only partially covers the bottom part of the fourth opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
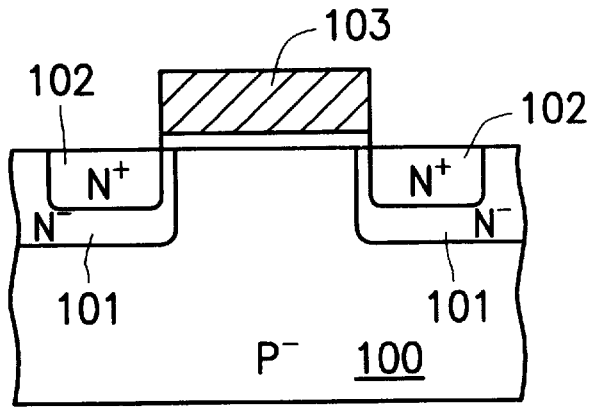
FIGS. 1A, 1B and 1C are cross-sectional views showing the structures of conventional high-voltage MOS devices.
Figure 1B:
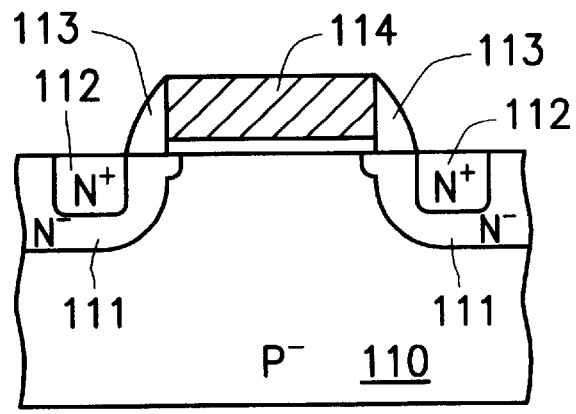
Figure 1C:
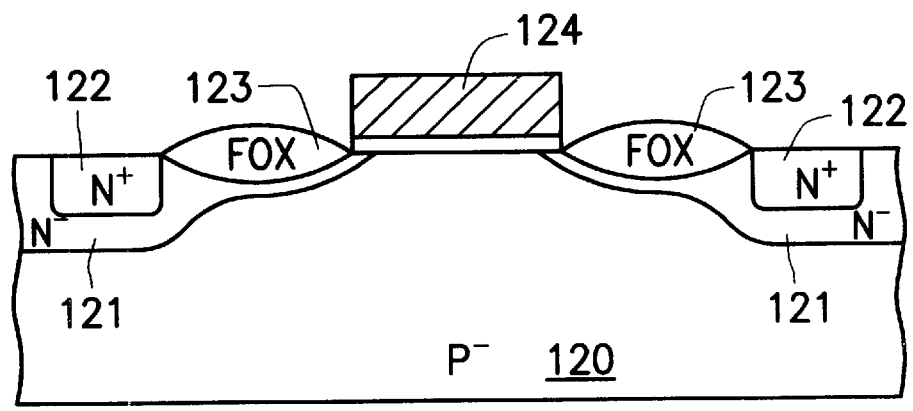

Reference will now be made in detail to the present preferred embodiments of the invention, examples of which are illustrated in the accompanying drawings. Wherever possible the same reference numbers are used in the drawings and the description to refer to the same or like parts.

Figure 2C:
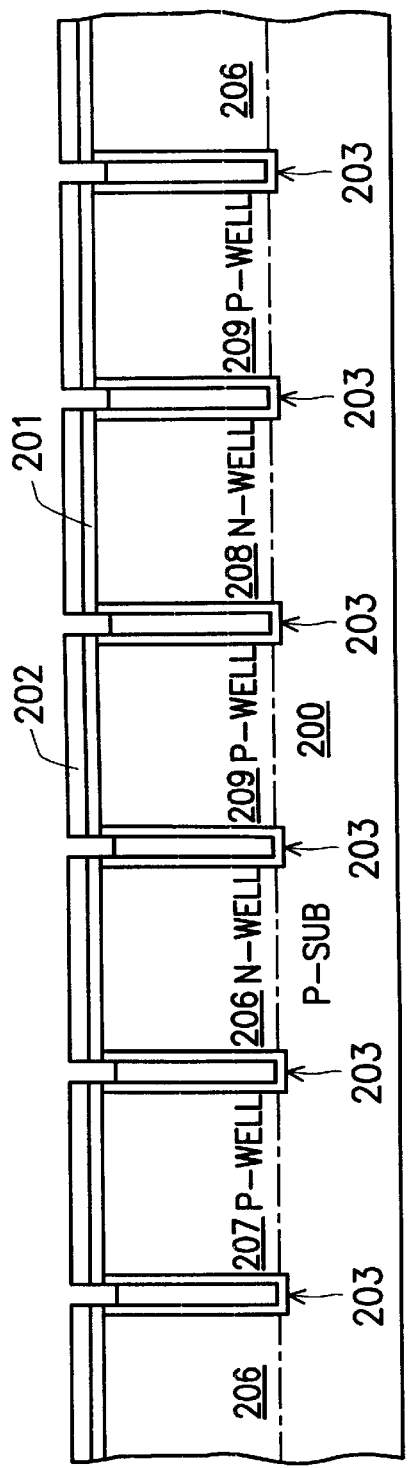
FIGS. 2A through 2Q are cross-sectional views showing the progression of manufacturing steps taken to fabricate an assembly with different types of high-voltage MOS devices according to one preferred embodiment of this invention.
Figure 2D:
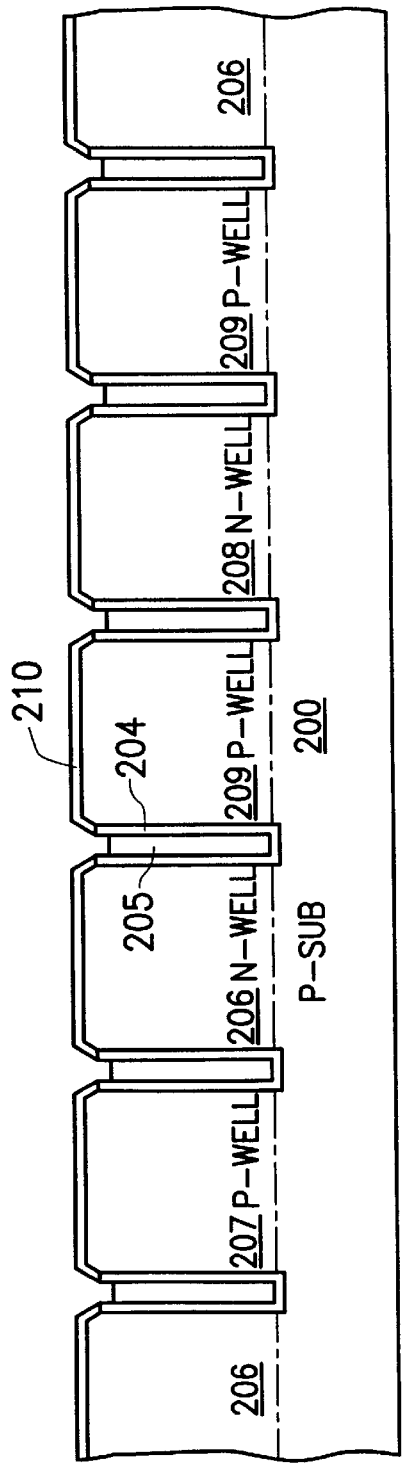
Figure 2E:
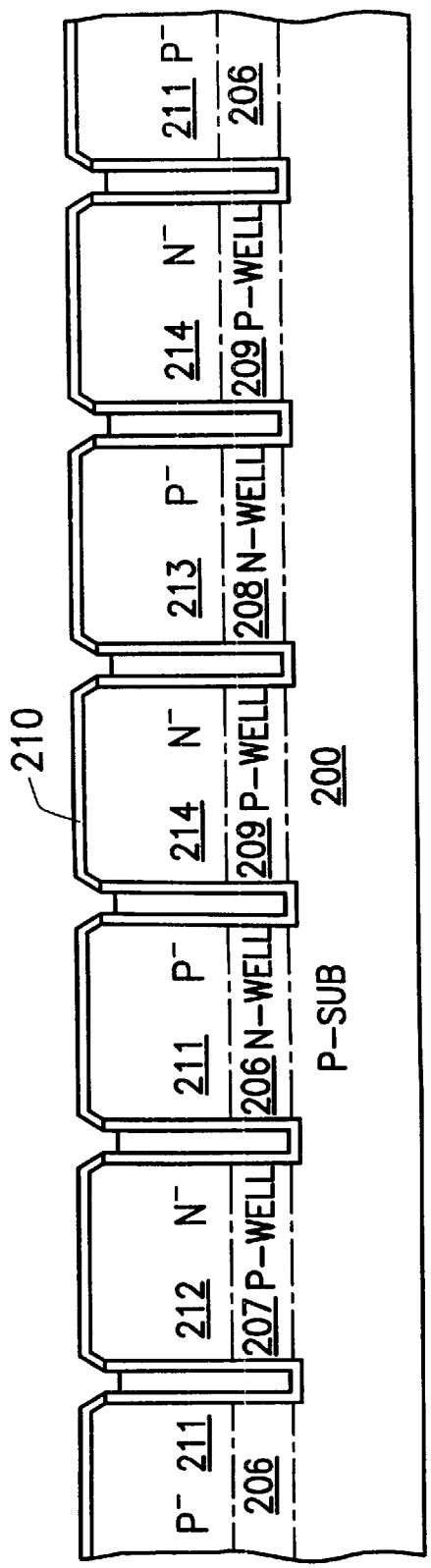
Figure 2F:
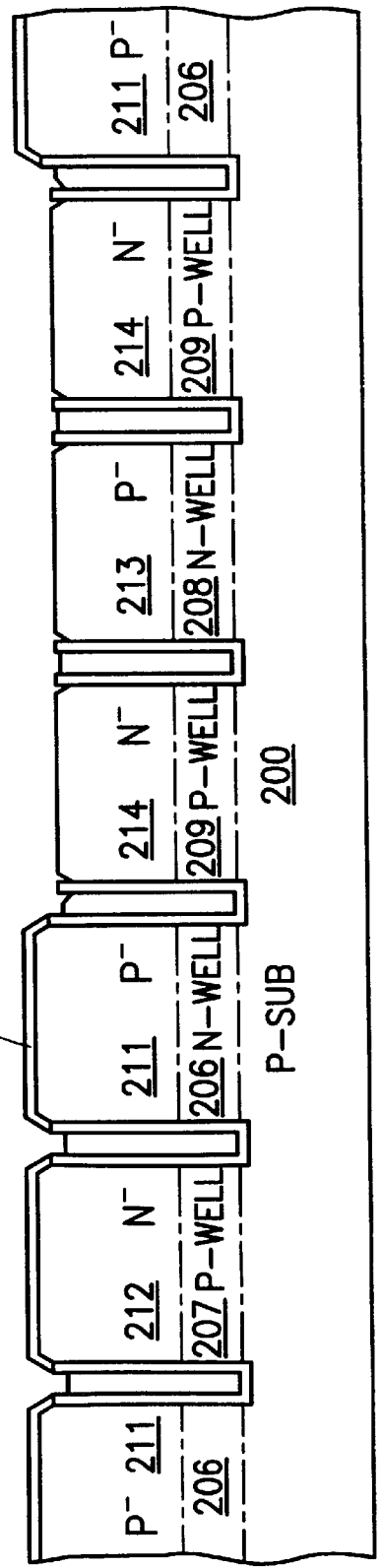
Figure 2I:
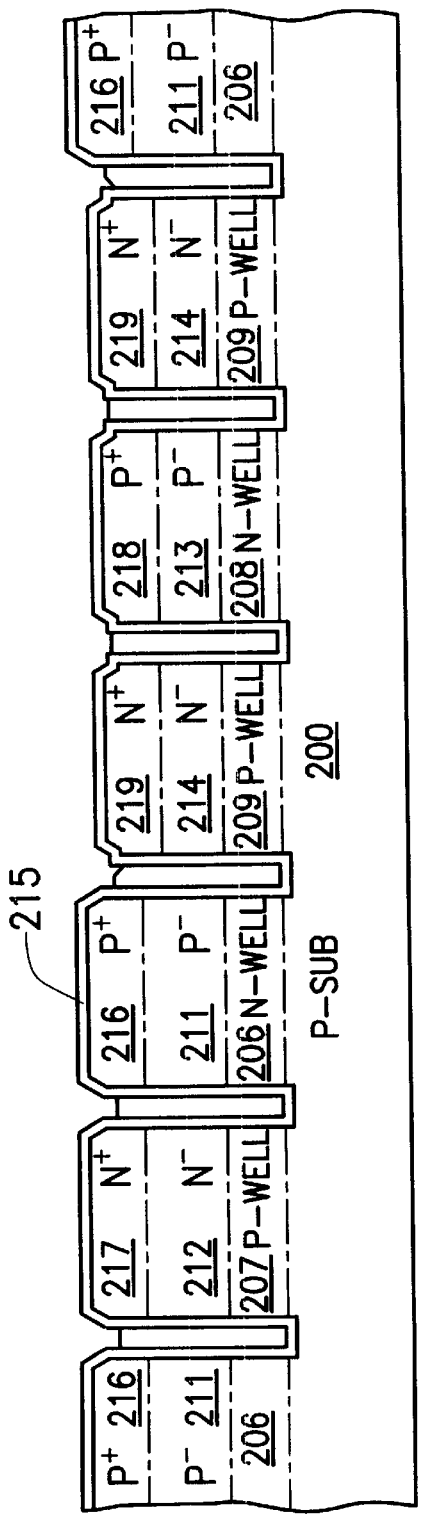
Figure 2J:
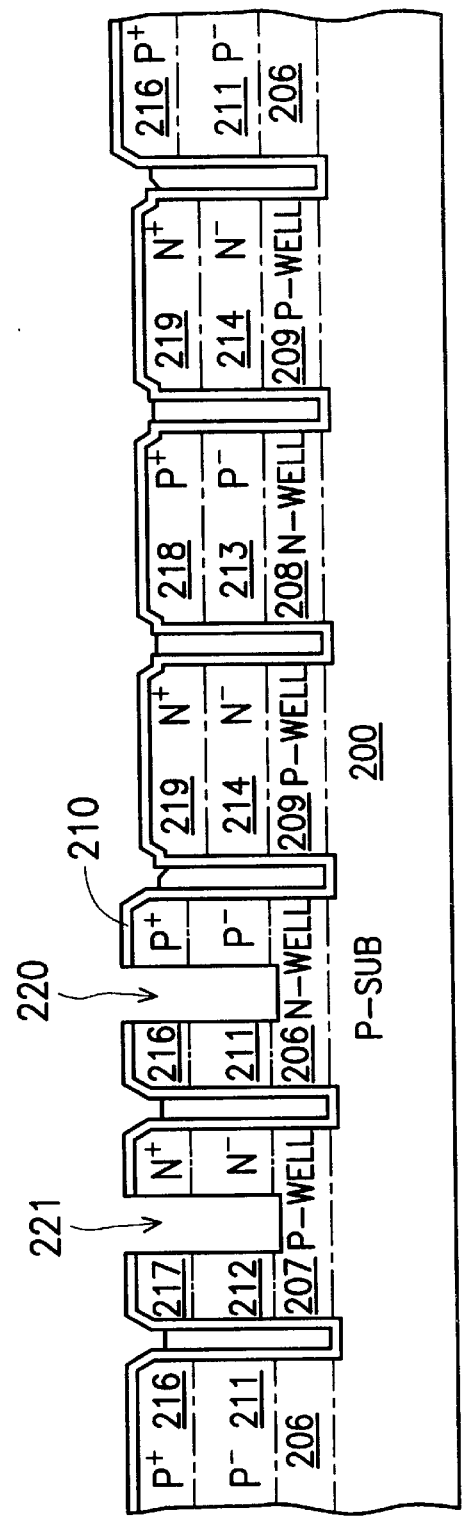
Figure 2O:
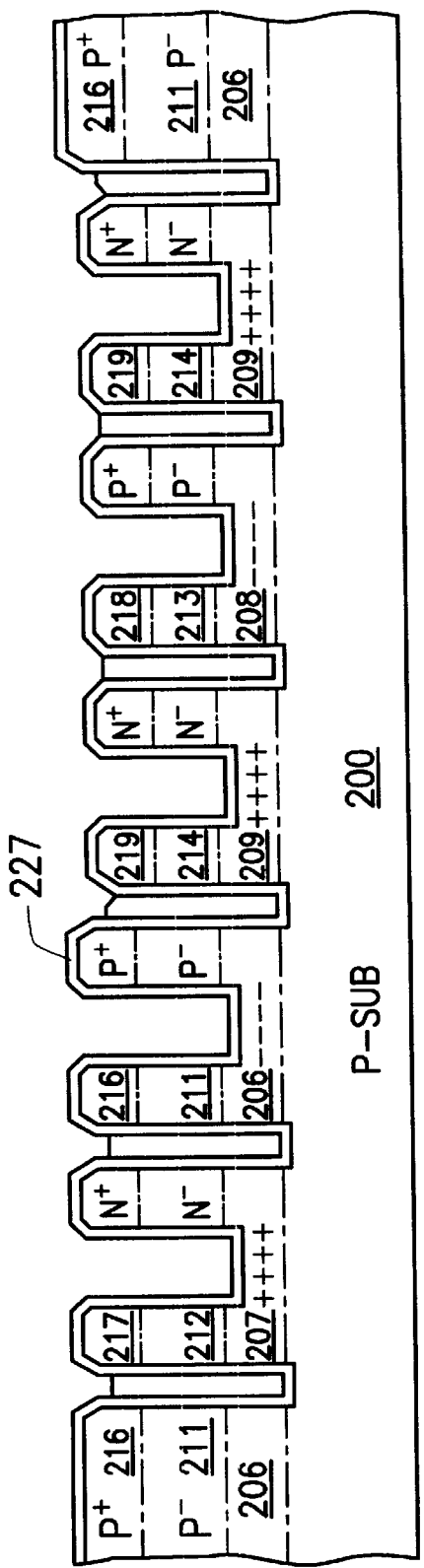
Figure 2P:
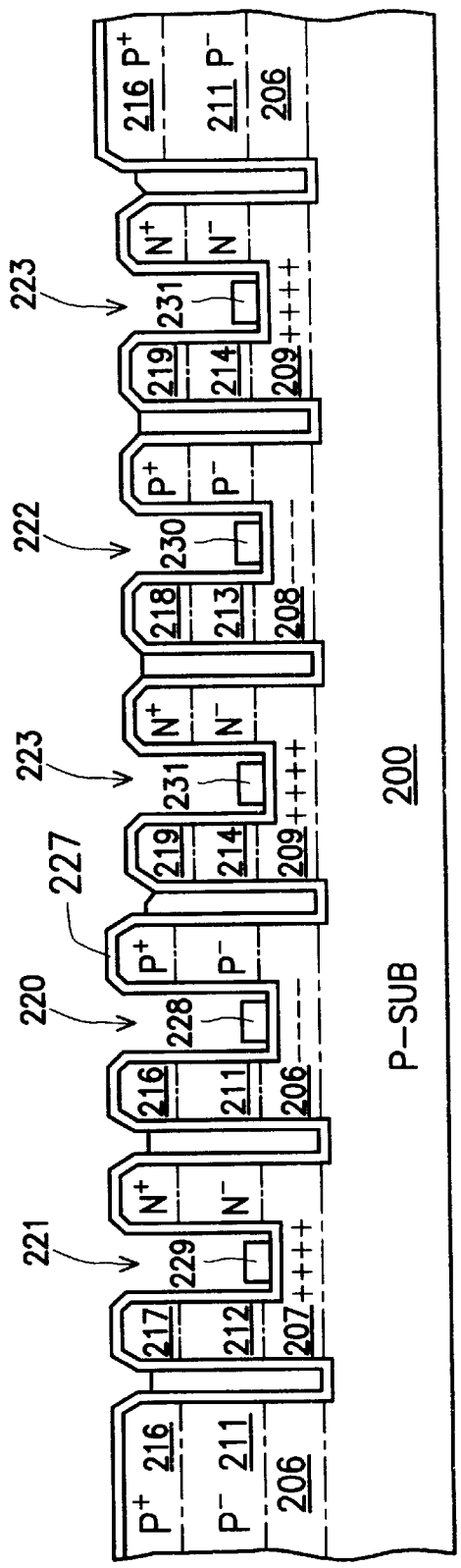
Figure 2Q:
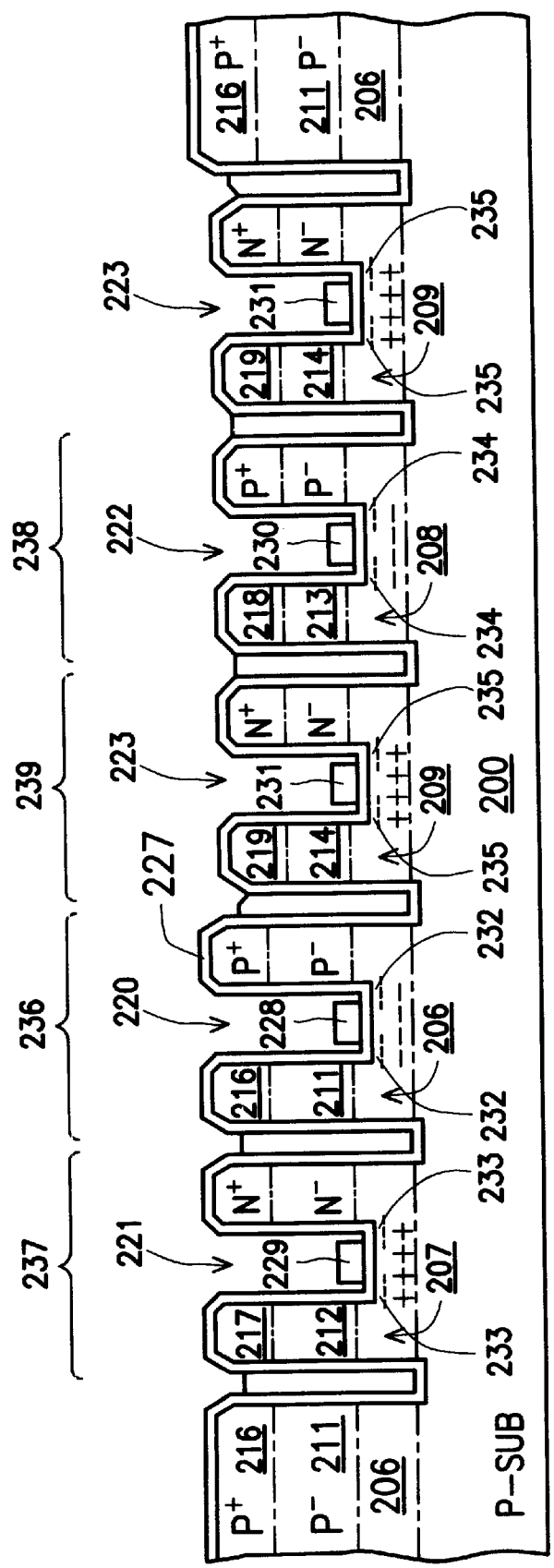

FIGS. 2A through 2Q are cross-sectional views showing the progression of manufacturing steps taken to fabricate an assembly with different types of high-voltage MOS devices according to one preferred embodiment of this invention.

First, as shown in FIG. 2A, a semiconductor substrate 200, for example, a P-type substrate, is provided. Then, a first oxide layer 201 and a first silicon nitride layer 202 are sequentially formed over the substrate 200. Next, the silicon nitride layer 202, the first oxide layer 201 and the substrate 200 are etched to form trenches 203. The trenches are ultimately used for fabricating isolation structures. The first oxide layer 201, often known as a pad oxide layer, is formed using a thermal oxidation method. The first silicon nitride layer 202 is formed using, for example, a chemical vapor deposition method.

Next, as shown in FIG. 2B, an oxidation is carried out to form a second oxide layer 204 over the trench 203 surface, and then a third oxide layer 205 is deposited into the trenches 203. For example, a high-density plasma chemical vapor deposition (HDPCVD) method can be used to deposit the third oxide layer 205.

Next, as shown in FIG. 2C, a first N-well 206, a first P-well 207, a second N-well 208 and a second P-well 209 are formed between the trenches 203. For example, N-type dopants are implanted into regions where N-wells are desired and P-type dopants are implanted into regions where P-wells are desired, and then heat is used to drive the dopants in Next, as shown in FIG. 2D, the silicon nitride layer 202 and the first oxide layer 201 are removed. Thereafter, a fourth oxide layer 210 is formed over the substrate 200, wherein the fourth oxide layer 210, also known as a pad oxide layer, can be formed by thermal oxidation.

Next, as shown in FIG. 2E, a first P⁻ region 211 is formed in the N-well 206, a first N⁻ region 212 is formed in the first P-well 207, a second P⁻ region 213 is formed in the second N-well 208 and a second N⁻ region 214 is formed in the second P-well 209. The first P⁻ region 211 and the second P⁻ region 213 are lightly doped P-type regions, and the first N⁻ region 212 and the second N⁻ region 214 are lightly doped N-type regions. For example, the first P⁻ region 211 and the second P⁻ region 213 are formed by implanting low level concentration P-type dopants into the respective first N-well 206 and the second N⁻ well 208, and then driven in by heating. Similarly, the first N⁻ region 212 and the second N⁻ region 214 are formed by implanting low level concentration N-type dopants into the respective first P-well 207 and the second P-well 209, and then driving in by heating.

Next, as shown in FIG. 2F, the fourth oxide layer 210 above the second N-well 208 and the second P-well 209 as well as a portion of the second P⁻ region 213 and the second N⁻ region 214 are removed so that the top surface of the second P⁻ region 213 and the second N⁻ region 214 is at a level lower than the top surface of the first P⁻ region 211 and the first N⁻ region 212. For example, a microlithographic operation together with a dry etching operation can be used to remove the fourth oxide layer 210 above the second N-well 208 and the second P-well 209, as well as a portion of the second P⁻ region 213 and the second N⁻ region 214.

Next as shown in FIGS. 2G and 2H, the fourth oxide layer 210 is removed, and then a thermal oxidation is carried out to form a fifth oxide layer 215 over the substrate 200. The fifth oxide layer is also known as a pad oxide layer.

Next, as shown in FIG. 2I, a first P⁺ region 216 is formed in the first N-well 206, and a second P⁺ region 218 is formed in the second N-well 208. Thereafter, a first N⁺ region 217 is formed in the first P-well 207 and a second N⁺ region 219 is formed in the second P-well 209. The first P⁺ region 216 and the second P⁺ region 218 are heavily doped P-type regions, and the first N⁺ region 217 and the second N⁺ region 219 are heavily doped N-type regions. For example, the first P⁺ region 216 and the second P⁻ region 218 are formed by implanting high level concentration P-type dopants into the respective first N-well 206 and the second N⁻ well 208, and then heat is used to drive the dopants in. Similarly, the first N⁺ region 217 and the second N⁺ region 219 are formed by implanting high level concentration N-type dopants into the respective first P-well 207 and the second P-well 209, and then heat is used to drive the dopants in.

As shown in FIG. 2I, the distances from the lower junction of the first N-well 206, the first P⁻ region 211 and the first P⁺ region 216 to the upper surface of the substrate 200 decrease in that order. Similarly, distances from the lower junction of the first P-well 207, the first N⁻ region 212 and the first N⁺ region 217 to the upper surface of the substrate 200 decrease in that order; distances from the lower junction of the second N-well 208, the second P⁻ region 213 and the second P⁺ region 218 to the upper surface of the substrate 200 decrease in that order; and distances from the lower junction of the second P-well 209, the second N⁻ region 214 and the second N⁺ region 219 to the upper surface of the substrate 200 decrease in that order. The first P⁺ region 216 and the second P⁺ region 218 function as the source/drain terminals of two different PMOS transistors, each having its own range of operating voltages. Similarly, the first N⁺ region 217 and the second N⁺ region 219 function as the source/drain terminals of two different NMOS transistors, each having its own range of operating voltages.

Next, as shown in FIG. 2J, a first etching operation is carried out to etch away a portion of the fifth oxide layer 210, the first P⁺ region 216 and the first P⁻ region 211 from the first N-well 206, using the interface between the first P⁻ region 211 and the first N-well 206 as an etching stop, and hence forming a first opening 220. Similarly, a portion a portion of the fifth oxide layer 210, the first N⁺ region 217 and the first N⁻ region 212 are etched away from the first P-well 207 using the interface between the first N⁻ region 212 and the first P-well 207 as an etching stop, and hence forming a second opening 221. The first etching operation can be a dry etching operation, for example.

Next, as shown in FIG. 2K, a second etching operation is conducted to etch away a portion of the fifth oxide layer 210, the second P⁺ region 218 and the second P⁻ region 213 from the second N-well 208, using the interface between the second P⁻ region 213 and the second N-well 208 as an etching stop, and hence forming a third opening 222. Similarly, a portion of the fifth oxide layer 210, the second N⁺ region 219 and the second N⁻ region 214 are etched away from the second P-well 208 using the interface between the second N⁻ region 214 and the second P-well 208 as an etching stop, thus forming a fourth opening 223. The second etching operation can also be a dry etching operation, for example.

Next, as shown in FIGS. 2L and 2M, the fifth oxide layer 210 is removed. Thereafter, thermal oxidation is used to form a sixth oxide layer 224 over the substrate 200. The purpose of removing the fifth oxide layer 210 and forming the sixth oxide layer 224 is to remove the sharp corners on the exposed surface of substrate 200. For example, sharp corners 225, shown in FIG. 2L, are reshaped into round corners 226 in FIG. 2M. The sixth oxide layer 224 is also known as a pad oxide layer.

Next, as shown in FIG. 2N, a PMOS punchthrough implant and a threshold voltage implant of the first N-well 206 and the second N-well 208 are carried out, and then a NMOS punchthrough implant and a threshold voltage implant of the first P-well 207 and the second P-well 209 are carried out. After that, the sixth oxide layer 224 is removed. For example, $P^{31}$ and $BF_2$ ions are used in the PMOS punchthrough implant and threshold voltage implant of the first N-well 206 and the second N-well 208 respectively, and $B^{11}$ and $BF_2$ ions are used in the NMOS punchthrough implant and threshold voltage implant of the first P-well 207 and the second P-well 209, respectively.

Next as shown in FIG. 2O, a gate oxide layer 227 is formed over the substrate 200. A chemical vapor deposition method or a thermal oxidation method is, for example, used to form the gate oxide layer 227.

Next, as shown in FIG. 2P, a first conductive layer 228 is formed over the gate oxide layer 227 at the bottom of the first opening 220 within the first N-well 206, a second conductive layer 229 is formed over the gate oxide layer 227 at the bottom of the second opening 221 within the first P-well 207, a third conductive layer 230 is formed over the gate oxide layer 227 at the bottom of the third opening 222 within the second N-well 208, and a fourth conductive layer 231 is formed over the gate oxide layer 227 at the bottom of the fourth opening 223 within the second P-well 209. For example, the first, second, third and fourth conductive layers 228, 229, 230 and 230 are formed by first depositing a polysilicon layer (not shown in the figure) over the substrate 200, and then doping the polysilicon (for example, using $POCl_3$).

Subsequently, the doped polysilicon layer is patterned to form a first conductive layer 228 in the first opening 220, a second conductive layer 229 in the second opening 221, a third conductive layer 230 in the third opening 222, and a fourth conductive layer 231 in the fourth opening 223. The first conductive layer 228 and the gate oxide layer 227 together form one type of PMOS gate, whereas the third conductive layer 230 and the gate oxide layer 227 together form another type of PMOS gate. Similarly, the second conductive layer 229 and the gate oxide layer 227 together form one type of NMOS gate, whereas the fourth conductive layer 231 and the gate oxide layer 227 together form another type of NMOS gate.

The first conductive layer 228 only partially covers the bottom of the first opening 220. Similarly, the second conductive layer 229 only partially covers the bottom of the second opening 221, the third conductive layer 230 only partially covers the bottom of the third opening 222, and the fourth conductive layer 231 only partially covers the bottom of the fourth opening 223.

Next, as shown in FIG. 2Q, low level concentration P-type dopants are implanted into the first N-well region 206 and the second N-well region 208, thereby forming a third $P^-$ region 232 within the first N-well 206 underneath the first opening 220 and a fourth $P^-$ region 234 within the second N-well 208 underneath the third opening 222. Similarly, low level concentration N-type dopants are implanted into the first P-well 207 and the second P-well 209, thereby forming a third $N^-$ region 233 within the first P-well 207 underneath the second opening 221 and a fourth $N^-$ region 235 within the second P-well 209 underneath the fourth opening 223. The first $P^-$ region 211 and the third $P^-$ region 232 function as the drift region of one type of PMOS, whereas the second $P^-$ region 213 and the fourth $P^-$ region 234 function as the drift region of another type of PMOS. Similarly, the first $N^-$ region 212 and the third $N^-$ region 233 function as the drift region of one type of NMOS, whereas the third $N^-$ region 214 and the fourth $N^-$ region 235 function as the drift region of another type of NMOS.

The following is a brief summary of the advantages of using the method of fabricating an assembly with different types of high-voltage MOS devices according to this invention.

According to one preferred embodiment of this invention, each type of high-voltage MOS device can have a drift region of its own. In other words, each type of high-voltage MOS device can have its own range of operating voltages. For example, as shown in FIG. 2Q, the total length of the drift region of the PMOS 236 is obtained by combining the depth of the first $P^-$ region 211 with the length of the third $P^-$ region 232, while the total length of the drift region of the PMOS 238 is obtained by combining the depth of the second $P^+$ region 213 with the length of the fourth $P^-$ region 234. Therefore, PMOS 236 and PMOS 238 each has a different capacity to withstand high voltages. Similarly, as shown in FIG. 2Q, the total length of the drift region of the NMOS 237 is obtained by combining the depth of the first $N^-$ region 212 with the length of the third $N^-$ region 233, while the total length of the drift region of the NMOS 239 is obtained by combining the depth of the second $N^-$ region 214 with the length of the fourth $N^-$ region 235. Therefore, NMOS 237 and NMOS 239 each has a different capacity to withstand high voltages.

Differences in characteristic voltage withstanding capacity for the above transistors result from the difference in relative height of the $N^-$ layers underneath the source/drain region. For example, the heights of the first $P^-$ region 211 and the second $P^-$ region 213 are different, and the heights of the first $N^-$ region 212 and the second $N^-$ region 214 are different. Therefore, one only has to employ multiple etching operations so that the heights of various $N^-$ regions or $P^-$ regions are micro-adjusted, and multiple high-voltage MOS devices, each working within a different voltage operating range, can be fabricated in the same integrated circuit. For example, $N^-$ regions and $P^-$ regions having different thicknesses can be formed by performing an etching operation as shown in FIG. 2F.

Another advantage is that the trenches 203 are used as isolating structures, instead of a field oxide layer as in a conventional method. In addition, a vertical voltage drop structure rather than a planar structure is employed so that a longer drift region can be fabricated within a unit area as shown in FIG. 2Q. Therefore, this invention is capable of fabricating MOS transistors into the sub-micron regime, and hence is able to increase the level of circuit integration on a silicon wafer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an assembly with different types of high-voltage metal-oxide-semiconductor (MOS) devices, comprising the steps of:

providing a semiconductor substrate, and then sequentially forming a first oxide layer and a silicon nitride layer over the semiconductor substrate;

etching away a portion of the silicon nitride layer, the first oxide layer and the substrate to form isolation trenches;

performing an oxidation to form a second oxide layer over the trench surface;

depositing a third oxide layer into the trenches;

forming a first N-well, a first P-well, a second N-well and a second P-well between the trenches so that the trenches act as isolation structures;

removing the silicon nitride layer and the first oxide layer;

forming a fourth oxide layer over the semiconductor substrate;

forming a first $P^-$ region within the first N-well and forming a second $P^-$ region within the second N-well;

forming a first $N^-$ region within the first P-well and forming a second $N^-$ region within the second P-well;

removing the fourth oxide layer above the second N-well and the second P-well, and removing a portion of the second $P^-$ region and the second $N^-$ region so that the top surface of the second $P^-$ region and the second $N^-$ region is lower than the top surface of the first $P^-$ region and the first $N^-$ region;

removing the remainder of the fourth oxide layer;

forming a fifth oxide layer over the semiconductor substrate;

forming a first $P^+$ region within the first N-well and a second $P^+$ region within the second N-well;

forming a first $N^+$ region within the first P-well and a second $N^+$ region within the second P-well;

performing a first etching operation, sequentially etching away a portion of the fifth oxide layer, the first $P^+$ region and the first $P^-$ region and stopping at the interface between the first $P^-$ region and the first N-well to form a first opening, and sequentially etching away a portion of the fifth oxide layer, the first $N^+$ region and the first $N^-$ region and stopping at the interface between the first $N^-$ region and the first P-well to form a second opening;

performing a second etching operation, sequentially etching away a portion of the fifth oxide layer, the second $P^+$ region and the second $P^-$ region and stopping at the interface between the second $P^-$ region and the second N-well to form a third opening, and sequentially etching away a portion of the fifth oxide layer, the second $N^+$ region and the second $N^-$ region and stopping at the interface between the second $N^-$ region and the second P-well to form a fourth opening;

removing the remainder of the fifth oxide layer;

forming a sixth oxide layer over the semiconductor substrate;

performing a PMOS punchthrough implant and a threshold voltage implant into the first N-well and the second N-well;

performing an NMOS punchthrough implant and a threshold voltage implant of the first P-well and the second P-well;

removing the sixth oxide layer;

forming a gate oxide layer over the semiconductor substrate;

forming a first conductive layer over the gate oxide layer at the bottom of the first opening within the first N-well, a second conductive layer over the gate oxide layer at the bottom of the second opening within the first P-well, a third conductive layer over the gate oxide layer at the bottom of the third opening within the second N-well, and a fourth conductive layer over the gate oxide layer at the bottom of the fourth opening within the second P-well;

implanting low level concentration P-type dopants into the first N-well and the second N-well, forming a third $P^-$ region underneath the first opening within the first N-well and a fourth $P^-$ region underneath the third opening within the second N-well; and implanting low level concentration N-type dopants into the first P-well and the second P-well forming a third $N^-$ region underneath the second opening within the first P-well and a fourth $N^-$ region underneath the fourth opening within the second P-well.

2. The method of claim 1, wherein the step of depositing the third oxide layer into the trench includes high-density plasma chemical vapor deposition.

3. The method of claim 1, wherein the step of forming the first N-well, the first P-well, the second N-well and the second P-well further includes implanting N-type dopants into regions where the first N-well and the second N-well are desired and implanting P-type dopants into regions where the first P-well and the second P-well are desired, and then heat is used to drive the dopants in.

4. The method of claim 1, wherein the first $P^-$ region and the second $P^-$ region are lightly doped P-type regions, and the first $N^-$ region and the second $N^-$ region are lightly doped N-type regions.

4. The method of claim 1, wherein the step of forming the first $P^-$ region in the first N-well, the second $P^-$ region in the second N-well, the first $N^-$ region in the first P-well and the second $N^-$ region in the second P-well further includes implanting low level concentration P-type dopants into the first N-well and the second N-well and implanting low level concentration N-type dopants into the first P-well and the second P-well, and then heat is used to drive the dopants in.

6. The method of claim 1, wherein the first $P^+$ region and the second $P^+$ region are heavily doped P-type regions, and the first $N^+$ region and the second $N^+$ region are heavily doped N-type regions.

5. The method of claim 1, wherein the step of forming the first $P^+$ region in the first N-well, the second $P^+$ region in the second N-well, the first $N^+$ region in the first P-well and the second $N^+$ region in the second P-well further includes implanting high level concentration P-type dopants into the first N-well and the second N-well and implanting high level concentration N-type dopants into the first P-well and the second P-well, and then heat is used to drive the dopants in.

6. The method of claim 1, wherein the step of performing the first etching operation includes a dry etching method.

7. The method of claim 1, wherein the step of performing the second etching operation includes a dry etching method.

8. The method of claim 1, wherein the step of removing the fifth oxide layer and forming the sixth oxide layer is used to remove any sharp corners on the surface of the substrate.

9. The method of claim 1, wherein the step of performing PMOS punchthrough implant and threshold voltage implant for the first N-well and the second N-well includes using $P^{31}$ and $BF_2$, respectively.

10. The method of claim 1, wherein the step of performing NMOS punchthrough implant and threshold voltage implant for the first P-well and the second P-well includes using $P^{11}$ and $BF_2$, respectively.

11. The method of claim 1, wherein the step of forming the first conductive layer, the second conductive layer, the third conductive layer and the fourth conductive layer includes depositing doped polysilicon.

12. The method of claim 1, wherein the step of forming the first conductive layer in the first opening, the second conductive layer in the second opening, the third conductive layer in the third opening and the fourth conductive layer in the fourth opening, further includes depositing polysilicon over the gate oxide layer at the bottom of the first opening, the second opening, the third opening and the fourth opening at the same time, then doping the polysilicon layer, and finally patterning the polysilicon layer.

13. The method of claim 1, wherein the first conductive layer only partially covers the bottom part of the first opening, the second conductive layer only partially covers the bottom part of the second opening, the third conductive layer only partially covers the bottom part of the third opening, and the fourth conductive layer only partially covers the bottom part of the fourth opening.

\* \* \* \* \*